United States Patent
Novotny et al.

(10) Patent No.: US 8,259,449 B2
(45) Date of Patent: Sep. 4, 2012

(54) SIDECAR IN-ROW COOLING APPARATUS AND METHOD FOR EQUIPMENT WITHIN AN ENCLOSURE

(75) Inventors: Shlomo D. Novotny, Wayland, MA (US); John P. Menoche, North Smithfield, RI (US); Joseph M. Capes, Northboro, MA (US); Michael J. Gagnon, Franklin, MA (US); David W. Roden, Coventry, RI (US)

(73) Assignee: Vette Corp., Portsmouth, NH (US)

( * ) Notice: Subject to any disclaimer, the term of this patent is extended or adjusted under 35 U.S.C. 154(b) by 406 days.

(21) Appl. No.: 12/622,661

(22) Filed: Nov. 20, 2009

(65) Prior Publication Data
US 2010/0126696 A1 May 27, 2010

Related U.S. Application Data

(60) Provisional application No. 61/116,717, filed on Nov. 21, 2008.

(51) Int. Cl.
*H05K 7/20* (2006.01)
(52) U.S. Cl. ......... 361/696; 361/694; 361/695; 361/701
(58) Field of Classification Search .................. 361/696, 361/701
See application file for complete search history.

(56) References Cited

U.S. PATENT DOCUMENTS

| | | | | |
|---|---|---|---|---|
| 6,119,768 A * | 9/2000 | Dreier et al. | ............ | 165/104.33 |
| 6,506,111 B2 * | 1/2003 | Sharp et al. | .................. | 454/184 |
| 6,775,137 B2 | 8/2004 | Chu et al. | | |
| 6,819,563 B1 * | 11/2004 | Chu et al. | ...................... | 361/696 |
| 6,896,612 B1 * | 5/2005 | Novotny | ....................... | 454/184 |
| 7,170,745 B2 * | 1/2007 | Bash et al. | ..................... | 361/695 |
| 7,397,661 B2 * | 7/2008 | Campbell et al. | ............ | 361/696 |
| 7,492,593 B2 * | 2/2009 | Campbell et al. | ............ | 361/696 |
| 7,679,909 B2 * | 3/2010 | Spearing et al. | ............. | 361/699 |
| 7,963,118 B2 * | 6/2011 | Porter et al. | ................. | 62/259.2 |
| 2001/0052412 A1 * | 12/2001 | Tikka | ............................ | 165/299 |
| 2003/0231467 A1 * | 12/2003 | Replogle et al. | .............. | 361/690 |
| 2006/0032609 A1 * | 2/2006 | Fernandez et al. | .............. | 165/54 |

OTHER PUBLICATIONS

"Liebert XDH Horizontal Row Cooler, Cooling for High Heat Density Equipment", Emerson Network Power, 2009, 2 pages.
"Cooling Solutions for the IT Environment", APC, 2007, 3 pages.

* cited by examiner

*Primary Examiner* — Gregory Thompson
(74) *Attorney, Agent, or Firm* — Brinks Hofer Gilson & Lione (57) ABSTRACT

A system and method for integrating sidecar liquid cooling components in-row with associated computer equipment enclosures is disclosed. It includes a fail-safe baffle to exhaust air, a transition frame and containment plenum. It uses standard hose configurations and includes a thermo-mechanical switch, not requiring power to open the component door.

20 Claims, 5 Drawing Sheets

SIDECAR IN-ROW COOLING APPARATUS AND METHOD FOR EQUIPMENT WITHIN AN ENCLOSURE

RELATED APPLICATIONS

This application claims the benefit of U.S. Provisional Application No. 61/116,717, filed Nov. 21, 2008; this application is herein incorporated in its entirety by reference.

FIELD OF THE INVENTION

The invention relates to a system and method to support cooling heat generating components, and more particularly, to a system and method for integrating liquid cooling components beside associated computer equipment racks.

BACKGROUND OF THE INVENTION

Competition among computing providers such as server farms, communications vendors, and data storage centers has generated a need for reliable, scalable cooling solutions as they expand their facilities. Increasing heat loads of electronics equipment requires improved cooling capabilities at the row and/or rack level. It becomes challenging to cool heat loads in excess of 5 kW per rack through traditional raised floor computer room air conditioning (CRAC) cooling. This is especially acute for components such as blade server racks with heat loads in excess of 18 kW per rack.

By using liquid cooling and bringing the cooling apparatus closer to the heat load, some performance gains and efficiencies can be achieved. However, chilled water (CW)-rear door heat exchangers (RDHx) and pumped refrigerant (PR)-RDHx are only capable of 18-20 kW total heat removal.

Current cooling topologies at the row and/or rack level include: 1) Rear Door Heat Exchangers; 2) In-Row Coolers; 3) Overhead Coolers; and 4) Close-Coupled heat containment systems. Each has difficulty accommodating rising heat loads.

Conventional sidecar cooling units are heat exchangers mounted beside equipment racks. They can provide redundancy by alternating multiple heat exchangers with racks. These are closed systems, where the server's hot exhaust is contained, preventing the heat from dissipating into the room air. However, known designs are expensive to manufacture and deploy.

Current cooling solution products are expensive, require hot aisle containment or rack containment, use fans and other moving parts, can be noisy, and consume significant amounts of energy to operate.

There is a need therefore, for an efficient, low labor, inexpensive, reliable and scalable apparatus and method for meeting the cooling needs of enterprises operating equipment generating increasingly greater heat loads.

SUMMARY OF THE INVENTION

A system and method for integrating sidecar liquid cooling components in-row with associated computer equipment racks is disclosed.

The simplified passive sidecar in-row cooler hybrid can be used with virtually any IT equipment rack, offering significant advantages over existing solutions. The disclosed integrated sidecar heat exchanger apparatus effectively deals with data center hot-spots and facilitates the deployment of fully loaded racks. Embodiments offer space savings and flexibility for sites that have often exceeded their cooling capacity. They decrease the load on air conditioning and, with separate cooling circuits, can provide redundancy and added shut-down time should air conditioning fail. For example, temperatures can climb 2 degrees Centigrade per minute following air conditioning failure, resulting in server shut down and 100 degree Fahrenheit temperatures in less than 15 minutes. Integrated sidecar heat exchanger systems are also an energy efficient data center cooling solution.

Embodiments include a sidecar liquid heat exchanger apparatus for cooling heat generating equipment comprising at least one rack back enclosure directing rack exit airflow from a heat generating equipment rack; at least one sidecar enclosure comprising an inlet and an outlet, wherein the inlet is configured to accept airflow from the at least one rack back enclosure; the at least one sidecar enclosure comprising at least one sidecar baffle at least partially intercepting the rack exhaust airflow and in at least a first mode directing at least a portion of the rack exhaust airflow into the at least one sidecar enclosure through the sidecar inlet, and in at least a second mode directing at least a portion of the rack exhaust airflow external to the at least one sidecar enclosure, whereby a failsafe mode is provided; and at least one heat exchanger element disposed within the at least one sidecar enclosure between the inlet and the outlet, wherein the at least one heat exchanger element surface area is configured to maintain impedance of airflow through the equipment rack. In other embodiments, the equipment rack rear enclosure comprises a passive rear door liquid heat exchanger (RDHx), wherein the RDHx receives exit airflow from the electronics rack and exhausts airflow at least partially toward the at least one sidecar baffle; and further comprising at least one transition frame integrating the heat generating equipment rack with the RDHx. In another embodiment, the sidecar liquid heat exchanger apparatus uses coolant hose connectors of the RDHx. Further embodiments comprise at least one thermo-mechanical switch to open the at least one sidecar baffle wherein power is not required, providing the at least one failsafe mode wherein the at least one sidecar baffle directs rack exhaust airflow external to the at least one sidecar enclosure. Another embodiment comprises a rack front-sidecar exit air enclosure wherein in at least one mode of the at least one sidecar baffle directs airflow through the at least one passive sidecar liquid heat exchanger apparatus providing enclosed rack cooling. In still other embodiments, at least one of the heat generating equipment rack and the sidecar liquid heat exchanger apparatus comprises at least one air moving device; and the sidecar liquid heat exchanger apparatus is passive, requiring no power. For another embodiment, liquid cooling of the rack replaces computer room air conditioning cooling and whereby overall power consumption is reduced.

Additional embodiment include a method for cooling heat generating equipment comprising the steps of employing a sidecar liquid heat exchanger apparatus for cooling heat generating equipment in a rack; directing rack exit exhaust airflow from the heat generating equipment rack through at least one rack back enclosure; at least partially intercepting the rack exit exhaust airflow by least one sidecar baffle, and in at least a first mode directing at least a portion of the rack exhaust airflow into at least one sidecar enclosure through at least one sidecar enclosure inlet, and in at least a second mode directing at least a portion of the rack exhaust airflow external to the at least one sidecar enclosure, whereby a failsafe mode is provided; accepting at least a portion of the rack exit airflow into the at least one sidecar enclosure in the at least first mode; cooling airflow in the at least at least one sidecar enclosure by at least one heat exchanger element disposed within the at least one sidecar enclosure between the sidecar inlet and sidecar outlet; and exhausting the sidecar airflow through the sidecar outlet. In yet another embodiment, the at least a first mode directs at least a portion of the rack exhaust airflow into the sidecar enclosure through the sidecar inlet whereby the sidecar exhaust airflow enters a cool aisle, and wherein the at least second mode airflow directs at least a portion of the rack exhaust airflow into a hot aisle, whereby the failsafe mode is provided. In other embodiments, the step of at least partially intercepting the rack exit exhaust airflow comprises movement of at least one sidecar baffle to switch between the first and the second modes, the movement comprising operation of at least one thermo-switch. Embodiments include airflow circulation through the passive sidecar liquid heat exchanger apparatus which provides redundant cooling of the at least one heat generating equipment rack; and also, sidecar exhaust air exiting the sidecar liquid heat exchanger apparatus is cooler than air entering the heat generating equipment rack.

Further embodiments include a liquid heat exchanger system for cooling heat generating equipment comprising at least one heat generating equipment rack comprising at least one air moving device for creating airflow over the heat generating equipment disposed in the at least one heat generating equipment rack; at least one rack back enclosure directing rack exit airflow from the heat generating equipment rack; at least one sidecar enclosure comprising an inlet and an outlet, whereby the inlet is configured to accept airflow from the at least one rack back enclosure; the at least one sidecar enclosure comprising at least one sidecar baffle in at least one mode at least partially intercepting the rack exhaust airflow directing at least a portion of the rack exhaust airflow into the at least one sidecar enclosure through the sidecar inlet; at least one heat exchanger element disposed within the at least one sidecar enclosure between the inlet and the outlet, wherein the at least one heat exchanger element surface area is configured to maintain impedance of airflow through the equipment rack. For other embodiments, the rack back enclosure comprises a passive rear door liquid heat exchanger (RDHx); and the system comprises a transition frame integrating the heat generating equipment rack with the RDHx. Another embodiment comprises a coolant distribution unit providing conditioned coolant to the at least one sidecar. In yet other embodiments, the at least one sidecar baffle provides at least first, second, third, and fourth operational modes wherein, the at least one sidecar comprises at least a first and at least a second sidecar; the at least one heat generating equipment rack comprises at least a first and a second heat generating equipment rack; the first sidecar and the second sidecar are disposed on either side of the first heat generating equipment rack; the second sidecar is disposed between the first heat generating equipment rack and the second heat generating equipment rack; the first operational mode provides cooling for the first heat generating equipment rack by both the first sidecar and the second sidecar; the second operational mode provides cooling for the first heat generating equipment rack by the first sidecar and provides cooling for the first and the second heat generating equipment racks by the second sidecar; the third operational mode provides cooling for the first heat generating equipment rack by the first sidecar and provides cooling for the second heat generating equipment rack by the second sidecar; and the fourth operational mode directs at least a portion of at least one of the at least a first and second heat generating equipment rack's exhaust airflow external to the at least one sidecar by the at least one sidecar baffle of the at least a first and second sidecar providing a failsafe mode. Yet further embodiments comprise at least one sidecar exit air enclosure whereby the at least one sidecar's exhaust airflow is circulated back into the at least one heat generating equipment rack.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

The invention is susceptible of many embodiments. What follows is illustrative, but not exhaustive of the scope of the invention.

In the description, relative terms such as "horizontal," "vertical," "up," "down," "top" and "bottom" as well as derivatives should be construed to refer to the orientation as then described or as shown in the drawing figure under discussion. These relative terms are for convenience of description and normally are not intended to require a particular orientation. Terms including "inwardly" versus "outwardly," "front" versus "back" and the like are to be interpreted relative to one another or relative to an axis as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" refers to such an attachment, coupling or connection that allows the pertinent structures to operate as intended by virtue of that relationship.

The term electronics rack is used interchangeably with electronics cabinet, equipment rack or rack in this application. It refers to a container for heat generating equipment. It may be any housing for containing components of an electronics system or computer system. Components may be standalone computers, power supplies, memory storage devices or communication interfaces, for example. The term heat exchanger is used to define any heat exchange mechanism through which coolant can circulate. It may include one or more discrete heat exchange devices coupled in series or in parallel.

Embodiments of the present invention provide a low-cost addition of liquid cooling to equipment racks and an easy upgrade path maintaining investment in racks. Provided space is available, installation can be performed with no down time.

Embodiments provide adaptation for in-row cooler use versus fully contained close-coupled rack cooling. Close-coupled systems push heat into a close-coupled heat containment enclosure such as a duct or return plenum including seals and gaskets to separate air zones and return hot air to the CRAC unit.

Embodiments deliver cold air to a cold aisle. They provide 30 kW nominal capacity for blade servers as within the American Society of Heating, Refrigerating, and Air-Conditioning Engineers (ASHRAE) new operating guidelines.

Embodiments accommodate 12" or 24" widths with the width determined, for example, by the required capacity. The depth in embodiments matches minimum 19" EIA rack depth—1,000 mm (39.4"). Embodiments provide a passive system, requiring no electrical connections. Embodiments are field retrofittable to existing IT racks, whether they are 19" or 24" EIA and regardless of rack depth.

Embodiments of the in-row cooler sidecar are standalone being separate and freestanding. Such embodiments are not designed to 'hang' on any specific rack design/size. Embodiments include a rack containment system, using a transition frame specific to rack model and size (depth, width and height dependent). Embodiments use existing Vette RDHx Transition Frames as disclosed in U.S. Patent Application No. 61/106,691 entitled "Rear Door Heat Exchanger Transition Frame" whose contents are included by reference herein.

Embodiments include a fail-safe design that is simple and inexpensive (dumps to hot aisle). A baffle thermo-mechanical switch is used in embodiments, not requiring power to open/close the enclosure or component door. Manual opening and closure is also provided.

Embodiments use a standard rack Vette containment plenum enclosure within a range of rack sizes. Other plenum types can be used. Embodiments provide a complete cooling architecture for up to at least 30 kW nominal capacity. In summary, embodiments use transition frames and a rack containment plenum within a range of rack sizes. This allows use of an RDHx initially, later supporting in-row cooling using the same transition frame.

Embodiments use the same hose connectors as a CW-RDHx to reduce cost and allow use of same CW-RDHx Hose Kits. Examples include as nonlimiting examples, Parker fittings vs. AeroQuip. They provide for 1-rack ratio or 1-2 ratios for redundancy and/or load-sharing. Embodiments have a failsafe baffle that opens outward upon failure (vs. inward). In embodiments, there are no electrical connections, and monitoring may be necessary. Monitoring can be accomplished at a coolant distribution unit (CDU).

Figure 1:
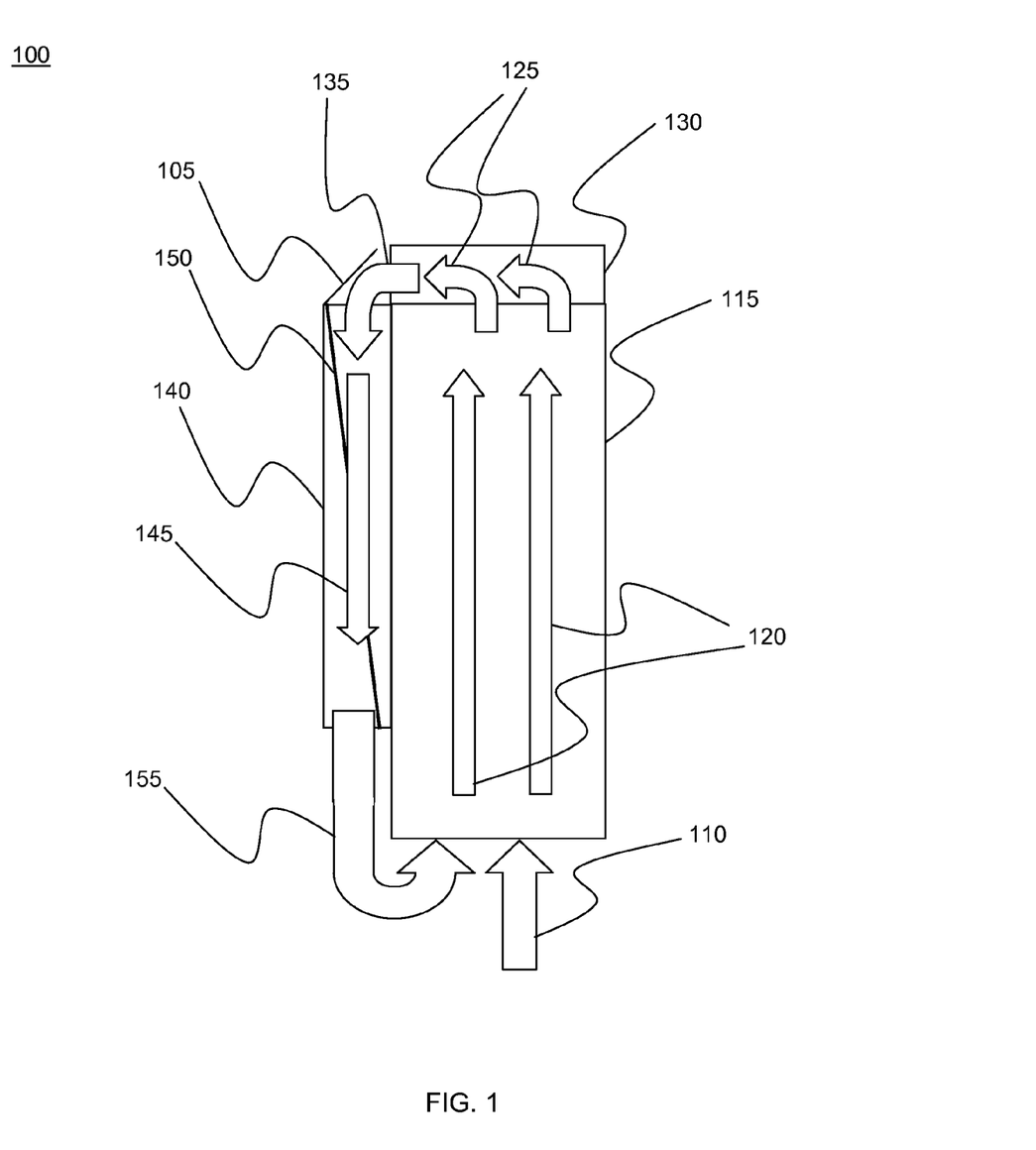
FIG. 1 is a simplified top plan view diagram of a closed baffle operational mode of an equipment rack configured with a sidecar in-row cooler in accordance with an embodiment.

FIG. 1 is a simplified top plan view diagram 100 of embodiments of a closed baffle operational mode of an equipment rack configured with a sidecar in-row cooler. Baffle 105 is depicted in a closed operating position. External airflow 110 enters equipment rack 115, flows through rack 115 as rack internal airflow 120, and exits as rack back airflow 125. Components may include rack back enclosure 130 directing rack back airflow 125 past baffle 105. Airflow proceeds as rack back exit airflow 135 past baffle 105 and enters sidecar heat exchanger 140. Sidecar internal air flow 145 in sidecar passes through one or more heat exchanger component(s) 150. Air exits from sidecar 140 as sidecar exit airflow 155. Sidecar exit airflow 155 exiting sidecar can enter ambient air including an option of a cold aisle. In embodiments it re-enters rack 115 with initial external airflow 110. Embodiments include components with various nonlimiting configurations such as 45 degree angle bends, beveled corners, right-angle corners, curved corners or any combination.

Figure 2:
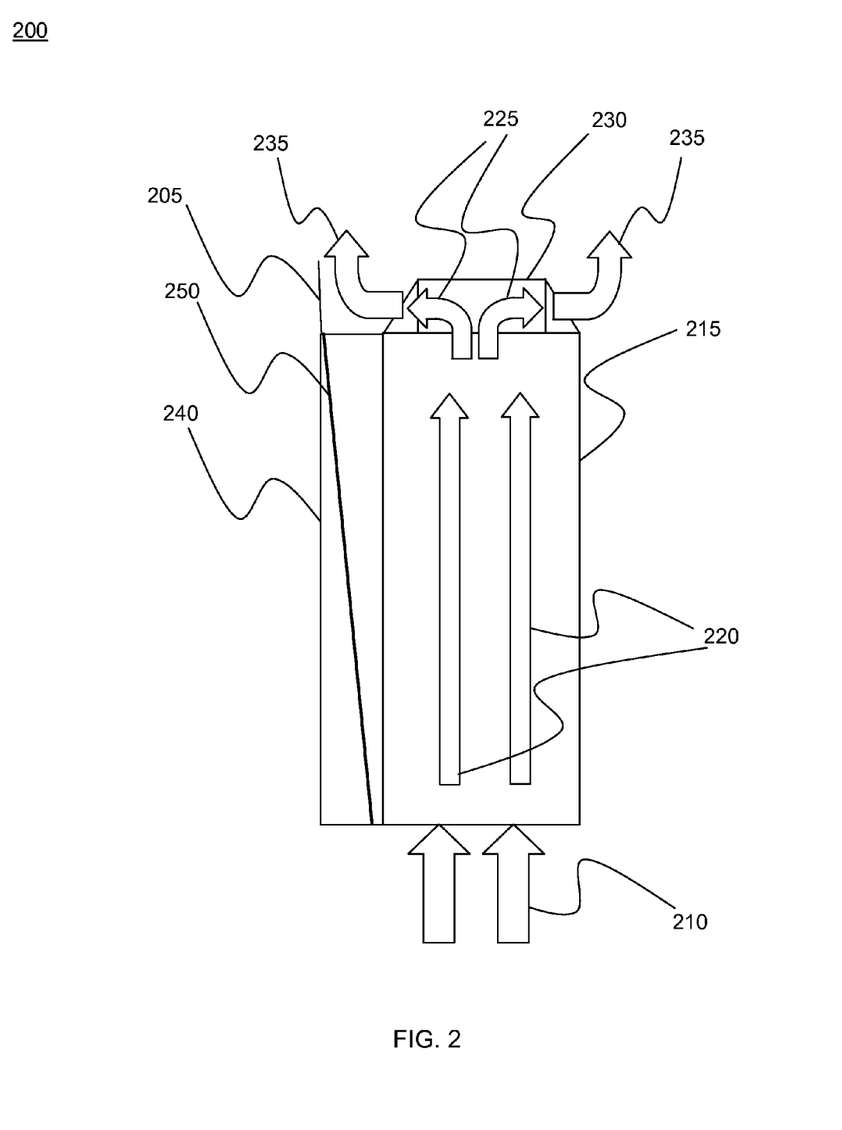
FIG. 2 is a simplified top plan view diagram of an open baffle operational mode of an equipment rack in accordance with an embodiment.

FIG. 2 is a simplified top view diagram 200 of an open baffle operational mode of an equipment rack configured with a sidecar in-row cooler. Baffle 205 is depicted in an open or failsafe operating position. This permits direct venting to the exterior of the equipment rack and can provide a failsafe operational mode. In embodiments, a failsafe mode reduces heat buildup compared to an airflow through the sidecar should the sidecar heat exchanger not provide cooling. Now following external airflow 210 enters equipment rack 215, flows through rack 215 as rack internal airflow 220, and exits as rack back airflow 225. Components may include rack back enclosure 230 where rack back airflow 225 is directed past open baffle 205. In this mode, airflow proceeds as rack back exit airflow 235 out past baffle 205 and exits without circulating through sidecar heat exchanger 240 including one or more heat exchanger component(s) 250. Embodiments employ more than one baffle. In embodiments, sidecar depth is equal to rack depth as shown in FIG. 2, or shallower as shown in FIG. 1. For embodiments, depths can be standard rack dimensions. Rack back exit airflow 235 exiting rack can enter ambient air including, in embodiments, a hot aisle. For embodiments, rack back enclosure 230 comprises a rear door heat exchanger. For other embodiments, the rear door heat exchanger comprises a transition frame that adapts the rear door heat exchanger to the equipment rack. The transition frame mounts the rear door heat exchanger to the equipment rack without requiring modifications to either, thereby supporting multiple rack manufacturers' models. As before, embodiments include components with various nonlimiting configurations such as 45 degree angle bends, beveled corners, right-angle corners, curved corners or any combination.

Figure 3:
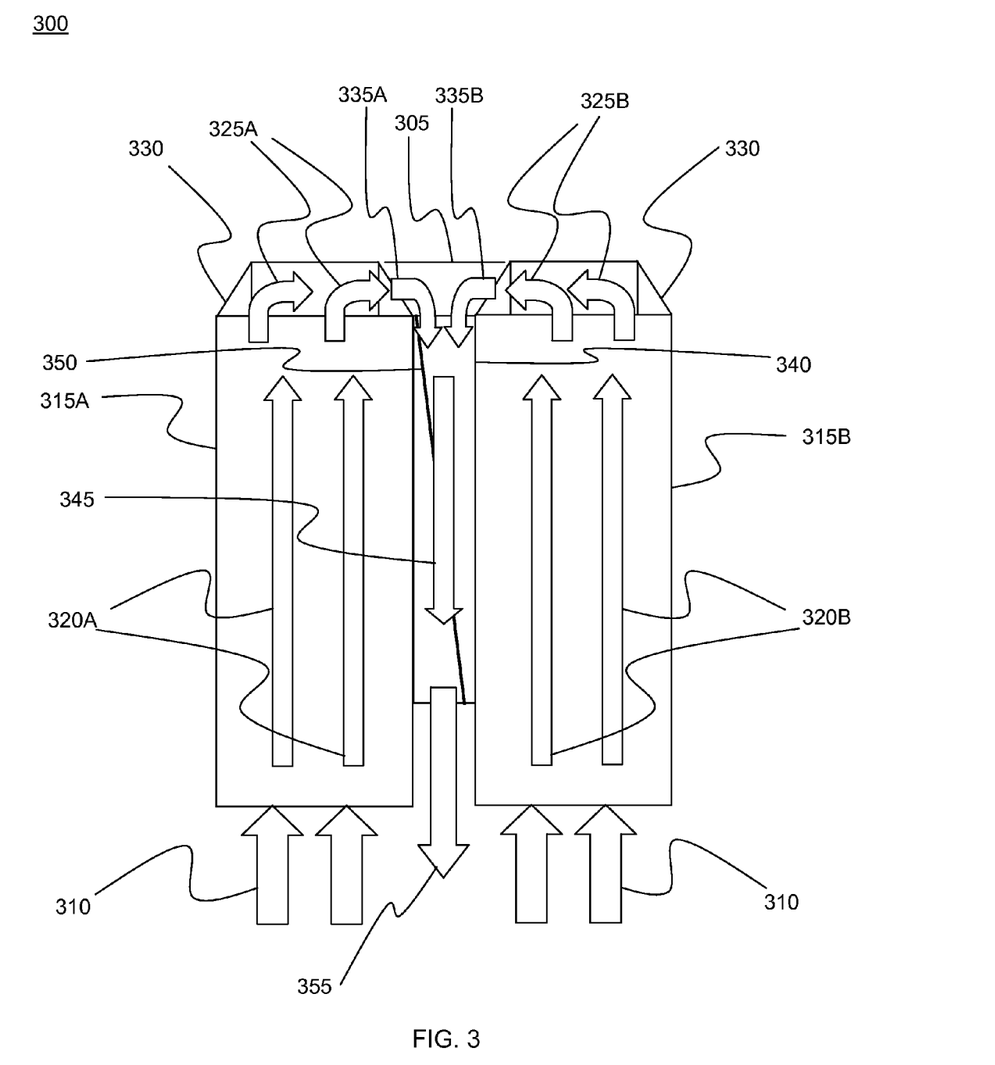
FIG. 3 is a simplified top plan view diagram of multiple equipment racks configured with a sidecar in-row cooler in accordance with an embodiment.

FIG. 3 is a simplified top view diagram 300 of multiple equipment racks configured with a sidecar in-row cooler. Baffle 305 is depicted in a closed operating position. External airflow 310 enters equipment racks 315A and 315B, flows through racks 315A and 315B as rack internal airflow 320A and 320B, and exits as rack back airflow 325A and 325B. Embodiment components include one or more rack back enclosures 330 directing rack back airflow 325 past baffle 305. Baffle 305 may comprise multiple components. Airflow proceeds as rack back exit airflow 335A and B past center baffle 305 and enters sidecar heat exchanger 340. Heated air exhausts to sidecar heat exchanger 340 between equipment racks 315A and 315B. Sidecar internal air flow 345 in sidecar passes through one or more heat exchanger component(s) 350. Air exits from sidecar 340 as sidecar exit airflow 355. Sidecar exit airflow 355 exiting sidecar can enter ambient air including an option of a cold aisle. In embodiments it re-enters rack 315 with initial external airflow 310. As before, embodiments include components with various nonlimiting configurations such as 45 degree angle bends, beveled corners, right-angle corners, curved corners or any combination.

Figure 4:
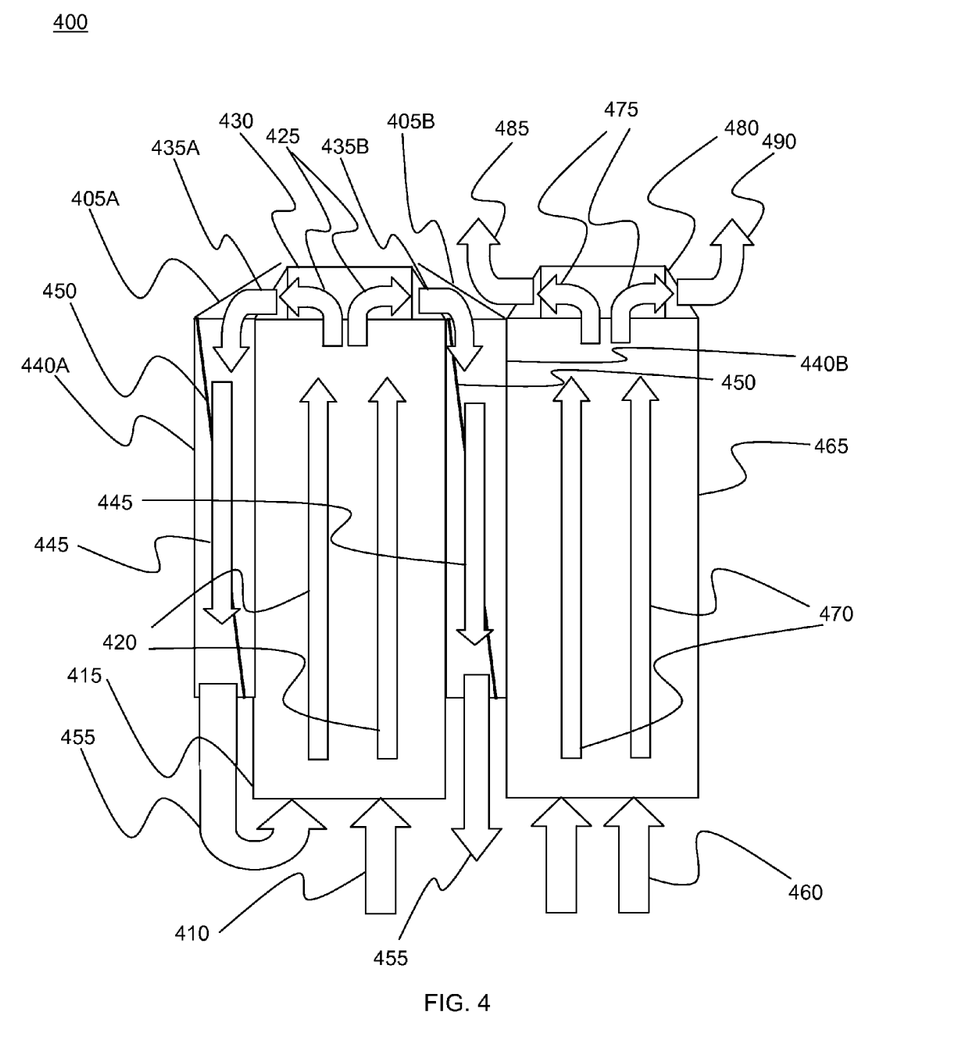
FIG. 4 is a simplified top plan view diagram of multiple sidecar in-row coolers in accordance with an embodiment.

FIG. 4 is a simplified top view diagram 400 of multiple equipment racks configured with multiple sidecar in-row coolers. Baffles 405A and 405B are depicted in a closed operating position. External airflow 410 enters equipment rack 415, flows through rack 415 as rack internal airflow 420, and exits as rack back airflow 425. Embodiment components include rack back enclosure 430, directing rack back airflow 425 past baffles 405A and B. Baffles 405A and B may comprise multiple components. Rack back exit airflow 435A and 435B proceeds past baffles 405A and 440B and enters sidecar heat exchangers 440A and 440B. Heated air exhausts to sidecar heat exchangers 440A and 440B (sidecars) beside equipment rack 415. Sidecar internal air flow 445 in sidecars passes through one or more heat exchanger component(s) 450. Air exits from sidecars 440 A and B as sidecar exit airflow 455. Sidecar exit airflow 455 exiting sidecar can enter ambient air including an option of a cold aisle. In embodiments it re-enters rack 415 with initial external airflow 410. Now, following external airflow 460 entering equipment rack 465, it flows through rack 465 as rack internal airflow 470 and exits as rack back airflow 475. Components may include rack back enclosure 480 where rack back exit airflow 485 is directed past baffle 405B. Rack back exit airflow 490 also exits rack back enclosure 480. In this mode, rack back exit airflow 485 proceeds out past baffle 405B and exits without circulating through sidecar heat exchanger 440B. Embodiments employ more than one baffle. Rack back exit airflow 485 and rack back exit airflow 490 exiting rack can enter ambient air including, in embodiments, a hot aisle. For embodiments, rack back enclosures 430 and or 480 comprise rear door heat exchangers. As previously, embodiments include components with various nonlimiting configurations such as 45 degree angle bends, beveled corners, right-angle corners, curved corners or any combination.

Figure 5:
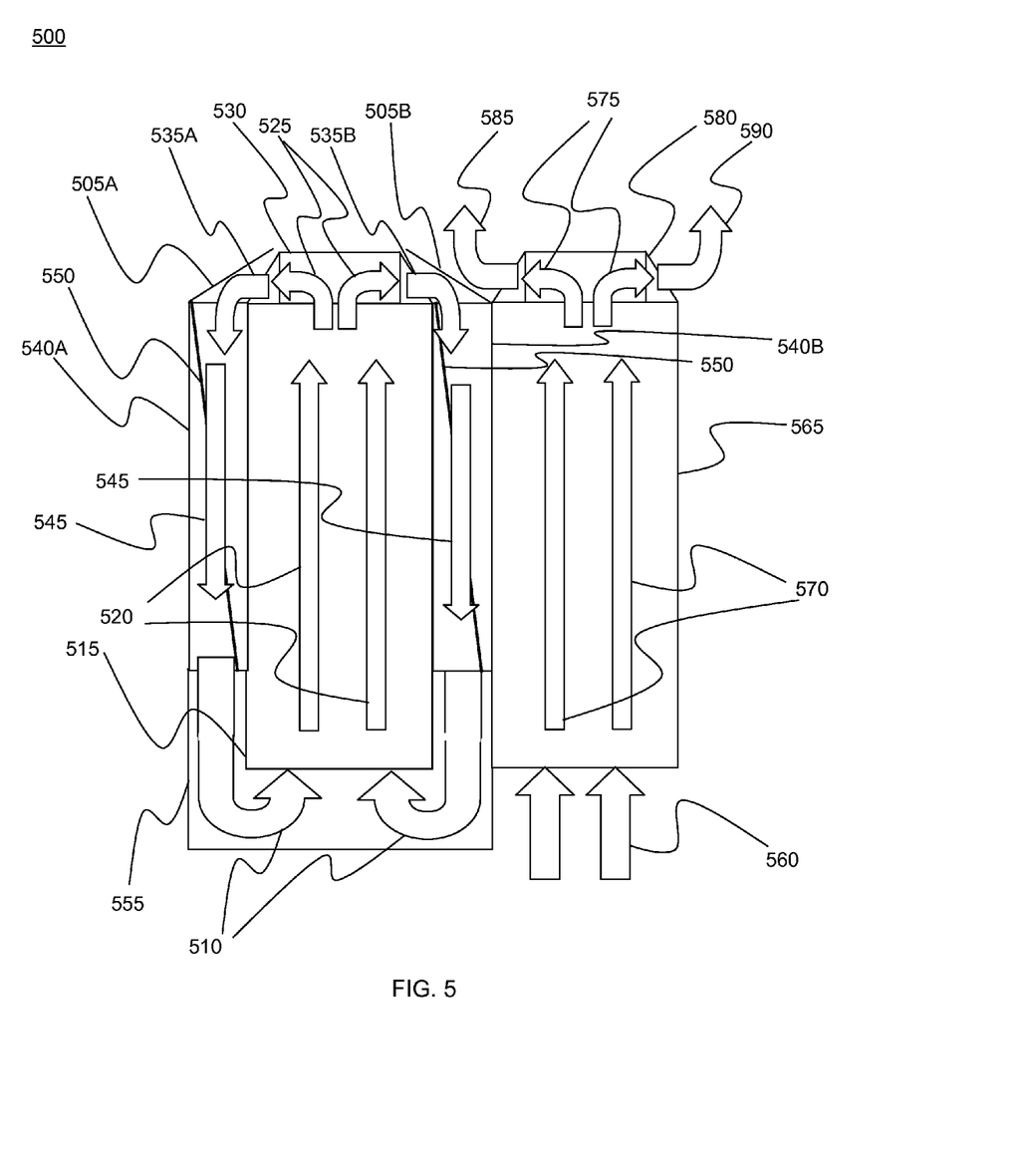
FIG. 5 is a simplified top plan view diagram of enclosed multiple sidecar in-row coolers in accordance with an embodiment.

FIG. 5 is a simplified top view diagram 500 of multiple equipment racks configured with multiple sidecar in-row coolers in a recirculation configuration. Baffles 505A and B are depicted in a closed operating position. Recirculating rack airflow 510 enters equipment rack 515, flows through rack 515 as rack internal airflow 520, and exits as rack back airflow 525. Embodiment components include rack back enclosure 530, directing rack back airflow 525 past baffles 505A and B. Baffles 505A and B may comprise multiple components. Rack back exit airflow 535A and B proceeds past baffles 505A and B and enters sidecar heat exchangers 540A and 540B. Heated air exhausts to sidecar heat exchangers 540A and 540B beside equipment rack 515. Sidecar internal airflow 545 in sidecars passes through one or more heat exchanger component(s) 550. Recirculating rack airflow 510 exits from sidecars 540A and 540B to recirculate. Exit air enclosure 555 directs air exiting sidecar coolers 540A and 540B into rack 515. Now following external airflow 560 entering equipment rack 565, it flows through rack 565 as rack internal airflow 570 and exits as rack back airflow 575. Components may include rack back enclosure 580 where rack back exit airflow 585 is directed past baffle 505B. Rack back exit airflow 590 also exits rack back enclosure 580. In this mode, rack back exit airflow 585 proceeds out past baffle 505B and exits without circulating through sidecar heat exchanger 540B. Embodiments employ more than one baffle. Rack back exit airflow 585 and 590 exiting rack can enter ambient air including, in embodiments, a hot aisle. For embodiments, rack back enclosures 530 and or 580 comprise rear door heat exchangers. As previously, embodiments include components with various nonlimiting configurations such as 45 degree angle bends, beveled corners, right-angle corners, curved corners or any combination. Configurations of multiple figures are combined to provide multiple modes of operation.

Elements of embodiments include a rack mating interface such as a transition frame that is easy to connect and provides thermal benefits such as control of thermal expansion. Mating interface embodiments provide easy connection, can conduct rack heat to a heat exchanger, and control thermal expansion.

Heat exchanger hose configurations are accommodated and air flow control such as air flow impedance is maintained. Embodiments provide size adaptability to variations in rack height and or width. Sealing methods enable easy installation, are ultra-reliable, and maintain thermal control. Hinge embodiments support locking, can hold the door open, and provide auto-opening.

Other and various embodiments will be readily apparent to those skilled in the art, from this description, figures, and the claims that follow.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A sidecar liquid heat exchanger apparatus for cooling heat generating equipment comprising:
    at least one rack back enclosure directing rack exit airflow from a heat generating equipment rack containing said heat generating equipment;
    at least one sidecar enclosure comprising an inlet and an outlet, wherein said inlet is configured to accept airflow from said at least one rack back enclosure;
    said at least one sidecar enclosure comprising at least one sidecar baffle at least partially intercepting said rack exit airflow and in at least a first mode directing at least a portion of said rack exit airflow into said at least one sidecar enclosure through said sidecar inlet, and in at least a second mode directing at least a portion of said rack exit airflow external to said at least one sidecar enclosure, whereby a failsafe mode is provided; and
    at least one heat exchanger element disposed within said at least one sidecar enclosure between said inlet and said outlet, wherein said at least one heat exchanger element surface area is configured to maintain impedance of airflow through said equipment rack.

2. The apparatus of claim 1, wherein said rack back enclosure comprises a passive rear door liquid heat exchanger (RDHx), wherein said RDHx receives exit airflow from said electronics rack and exhausts airflow at least partially toward said at least one sidecar baffle.

3. The apparatus of claim 2, comprising at least one transition frame integrating said heat generating equipment rack with said RDHx.

4. The apparatus of claim 2, wherein said sidecar liquid heat exchanger apparatus uses coolant hose connectors of said RDHx.

5. The apparatus of claim 1, comprising at least one thermo-mechanical switch to open said at least one sidecar baffle wherein power is not required, providing said at least one failsafe mode wherein said at least one sidecar baffle directs rack exhaust airflow external to said at least one sidecar enclosure.

6. The apparatus of claim 1, further comprising a rack front-sidecar exit air enclosure wherein in at least one rack front-sidecar exit air enclosure mode, said at least one sidecar baffle directs airflow through said sidecar liquid heat exchanger apparatus providing enclosed rack cooling.

7. The apparatus of claim 1, wherein at least one of said heat generating equipment rack and said sidecar liquid heat exchanger apparatus comprises at least one air moving device.

8. The apparatus of claim 1, wherein said sidecar liquid heat exchanger apparatus is passive, requiring no power.

9. The apparatus of claim 1, wherein liquid cooling of said rack replaces computer room air conditioning cooling and whereby overall power consumption is reduced.

10. A method for cooling heat generating equipment comprising the steps of:

employing a sidecar liquid heat exchanger apparatus for cooling said heat generating equipment in a heat generating equipment rack;

directing rack exit airflow from said heat generating equipment rack through at least one rack back enclosure;

at least partially intercepting said rack exit airflow by at least one sidecar baffle, and in at least a first mode directing at least a portion of said rack exit airflow into at least one sidecar enclosure of said sidecar liquid heat exchanger apparatus through at least one sidecar enclosure inlet, and in at least a second mode directing at least a portion of said rack exit airflow external to said at least one sidecar enclosure, whereby a failsafe mode is provided;

accepting at least a portion of said rack exit airflow into said at least one sidecar enclosure in said at least first mode;

cooling airflow in said at least one sidecar enclosure by at least one heat exchanger element disposed within said at least one sidecar enclosure between said at least one sidecar enclosure inlet and a sidecar outlet of said at least one sidecar enclosure; and exhausting said airflow from said at least one sidecar enclosure through said sidecar outlet.

11. The method of claim 10, wherein said at least a first mode directs at least a portion of said rack exit airflow into said sidecar enclosure through said sidecar inlet whereby said sidecar exit airflow enters a cool aisle, and wherein said at least second mode airflow directs at least a portion of said rack exit airflow into a hot aisle, whereby said failsafe mode is provided.

12. The method of claim 10, wherein said step of at least partially intercepting said rack exit airflow comprises movement of at least one sidecar baffle to switch between said first and said second modes, said movement comprising operation of at least one thermo-switch.

13. The method of claim 10, whereby airflow circulation through said passive sidecar liquid heat exchanger apparatus provides redundant cooling of said at least one heat generating equipment rack.

14. The method of claim 10, whereby said sidecar exit airflow exiting said sidecar liquid heat exchanger apparatus is cooler than air entering said heat generating equipment rack.

15. A liquid heat exchanger system for cooling heat generating equipment comprising:

at least one heat generating equipment rack containing said heat generating equipment comprising at least one air moving device for creating airflow over said heat generating equipment disposed in said at least one heat generating equipment rack;

at least one rack back enclosure directing rack exit airflow from said heat generating equipment rack;

at least one sidecar enclosure comprising an inlet and an outlet, whereby said inlet is configured to accept airflow from said at least one rack back enclosure;

said at least one sidecar enclosure comprising at least one sidecar baffle in at least one mode at least partially intercepting said rack exit airflow directing at least a portion of said rack exit airflow into said at least one sidecar enclosure through said sidecar inlet;

at least one heat exchanger element disposed within said at least one sidecar enclosure between said inlet and said outlet, wherein said at least one heat exchanger element surface area is configured to maintain impedance of airflow through said equipment rack.

16. The system of claim 15, wherein said rack back enclosure comprises a passive rear door liquid heat exchanger (RDHx).

17. The system of claim 16, comprising a transition frame integrating said heat generating equipment rack with said RDHx.

18. The system of claim 16, comprising a coolant distribution unit providing conditioned coolant to said liquid heat exchanger system.

19. The system of claim 15, wherein said at least one sidecar baffle provides at least first, second, third, and fourth operational modes, said at least one mode comprising said at least first, second, third, and fourth operational modes, wherein, said at least one sidecar comprises at least a first and at least a second sidecar;

said at least one heat generating equipment rack comprises at least a first and a second heat generating equipment rack;

said first sidecar and said second sidecar are disposed on either side of said first heat generating equipment rack;

said second sidecar is disposed between said first heat generating equipment rack and said second heat generating equipment rack;

said first operational mode provides cooling for said first heat generating equipment rack by both said first sidecar and said second sidecar;

said second operational mode provides cooling for said first heat generating equipment rack by said first sidecar and provides cooling for said first and said second heat generating equipment racks by said second sidecar;

said third operational mode provides cooling for said first heat generating equipment rack by said first sidecar and provides cooling for said second heat generating equipment rack by said second sidecar; and said fourth operational mode directs at least a portion of at least one of said at least a first and second heat generating equipment rack's exhaust airflow external to said at least one sidecar by said at least one sidecar baffle of said at least a first and second sidecar providing a failsafe mode.

20. The system of claim 15, comprising at least one sidecar exit air enclosure whereby sidecar exit airflow of said at least one sidecar is circulated back into said at least one heat generating equipment rack.

* * * * *